(12) United States Patent
Steketee

(10) Patent No.: US 6,170,329 B1
(45) Date of Patent: Jan. 9, 2001

(54) TEST FIXTURE CUSTOMIZATION ADAPTER ENCLOSURE

(75) Inventor: Edward Steketee, Ft. Collins, CO (US)

(73) Assignee: Agilent Technologies, Inc., Palo Alto, CA (US)

(*) Notice: Under 35 U.S.C. 154(b), the term of this patent shall be extended for 0 days.

(21) Appl. No.: 09/333,134

(22) Filed: Jun. 14, 1999

(51) Int. Cl.[7] ................................................. G01R 31/02
(52) U.S. Cl. ........................................................... 73/431
(58) Field of Search ................................... 73/431, 865.6, 73/865.8, 865.9; 324/511, 555, 537, 754–761, 765; 379/1, 6; 455/226.1, 226.4, 67.1, 67.2, 67.4; 381/58

(56) References Cited

U.S. PATENT DOCUMENTS

| | | | |
|---|---|---|---|
| 4,812,754 | * | 3/1989 | Tracy et al. . |
| 4,978,914 | * | 12/1990 | Akimoto et al. ..................... 324/760 |
| 4,980,636 | * | 12/1990 | Romanofsky et al. ............... 324/754 |
| 5,828,223 | * | 10/1998 | Rabkin et al. ....................... 324/754 |
| 5,926,027 | * | 7/1999 | Bumb, Jr. et al. ................... 324/765 |
| 6,018,249 | * | 1/2000 | Akram et al. ........................ 324/755 |

* cited by examiner

Primary Examiner—Robert Raevis

(57) ABSTRACT

An improvement in the enclosure assembly for automated testing devices. The enclosure includes various modular components, such that one components contains common elements and another component contains unique elements. The common elements may be elements found in a design family and the unique elements may be the unique feature of a device in a design family. The customized and common components are mounted in a chassis and enclosed with a cover.

15 Claims, 3 Drawing Sheets

TEST FIXTURE CUSTOMIZATION ADAPTER ENCLOSURE

REFERENCE TO RELATED APPLICATIONS

The present invention is related to co-pending and commonly assigned U.S. patent applications Ser. No. 09/026,066, entitled "REMOVABLE FIXTURE ADAPTER WITH PNEUMATIC ACTUATORS", the disclosure of which is incorporated by reference; Ser. No. 09/026,083, entitled "REMOVABLE FIXTURE ADAPTER WITH RF CONNECTIONS", the disclosure of which is incorporated by reference; and Ser. No. 09/026,307, entitled "DRAWER STYLE FIXTURE WITH INTEGRAL RF DOOR", the disclosure of which is incorporated by reference.

TECHNICAL FIELD OF THE INVENTION

This invention relates in general to test fixture adapter enclosures. In particular, the invention relates to various modular components that embody a test fixture customization adapter enclosure which holds a device under test.

BACKGROUND OF THE INVENTION

An automatic testing machine (ATM) operates in a production environment to rapidly and accurately test the operation and performance of various types of devices under test (DUT). The DUTs could be a finished product or a component of a larger system The ATM is programmed to perform various tests on the DUT.

ATMs are made flexible by the use of test fixtures. A test fixture provides an interface between the DUT and the ATM. Thus, a single ATM can perform tests on devices with different interfaces when connected via different test fixtures. Fixtures typically have a drawer mechanism, which opens up and allows the DUT to be placed inside the fixture. The fixture may have a RF cable that is fixedly mounted within. Also, fixtures may use pneumatic actuators that are constructed directly onto the drawer mechanism of the fixture. These hardwired aspects makes fixtures extremely difficult to reconfigure, because all of the fixture elements are integrally built into the fixture.

Furthermore, test fixtures tend to be large and bulky. Moreover, they have numerous connections to the ATM to allow testing of various parameters, e.g., power, electronic signals, RF signals, and pneumatic air pressure. Thus, changing test fixtures is time consuming, because individual connection to the ATM must be separated. In addition, the current fixture must be removed, and then the new fixture installed. During the replacement process, the production line is shut down, which results in lost production time.

If the fixture needs to be repaired, then lost production time is unavoidable. However, if the fixture is to be changed merely to accommodate a different DUT, then the lost production time can be mitigated by using an adapter. An adapter is a DUT holder that is coupled to the fixture on the drawer mechanism. The adapter is customized to hold a specific type of DUT.

However, the adapter is comprised of a set of machined base plate and side rails. These parts incorporate all the features required to interface a DUT to the fixture. With this design the pneumatic tubing and electrical connections are routed through channels and ports machined in the base plate and side rails. Thus, a unique adapter design is required for each device to be tested in the fixture. Device specific positioning of actuators and sensors and routing of air lines and cables results in a complex assembly, thus driving increased prototyping, fabrication and assembly time and high component cost.

Therefore, there is a need in the art for a system and method that allows for reduction in the complexity and quantity of the interface components and a standardized enclosure to reduce overall design time and material cost.

SUMMARY OF THE INVENTION

The present invention overcomes the difficulties and shortcomings of the prior art by providing a test fixture customization adapter enclosure comprised of various modular components. The test fixture is preferably comprised of a chassis assembly, fixture interconnect assembly, customization base and a cover. The chassis assembly forms the foundation for the enclosure. The fixture interconnect assembly is a modular component which includes elements common to a design family. The customization base is a modular component which holds a custom DUT engagement mechanism. Both the fixture interconnect assembly and the customization base are connected to one another and mounted to the chassis assembly. The cover completes the enclosure by covering the fixture interconnect assembly and DUT engagement mechanism. The use of modular components with common and customized elements on separate components solves the aforementioned problems of the prior art.

The foregoing has outlined rather broadly the features and technical advantages of the present invention in order that the following detailed description of a preferred embodiment of the invention may be better understood. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims and their equivalents.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
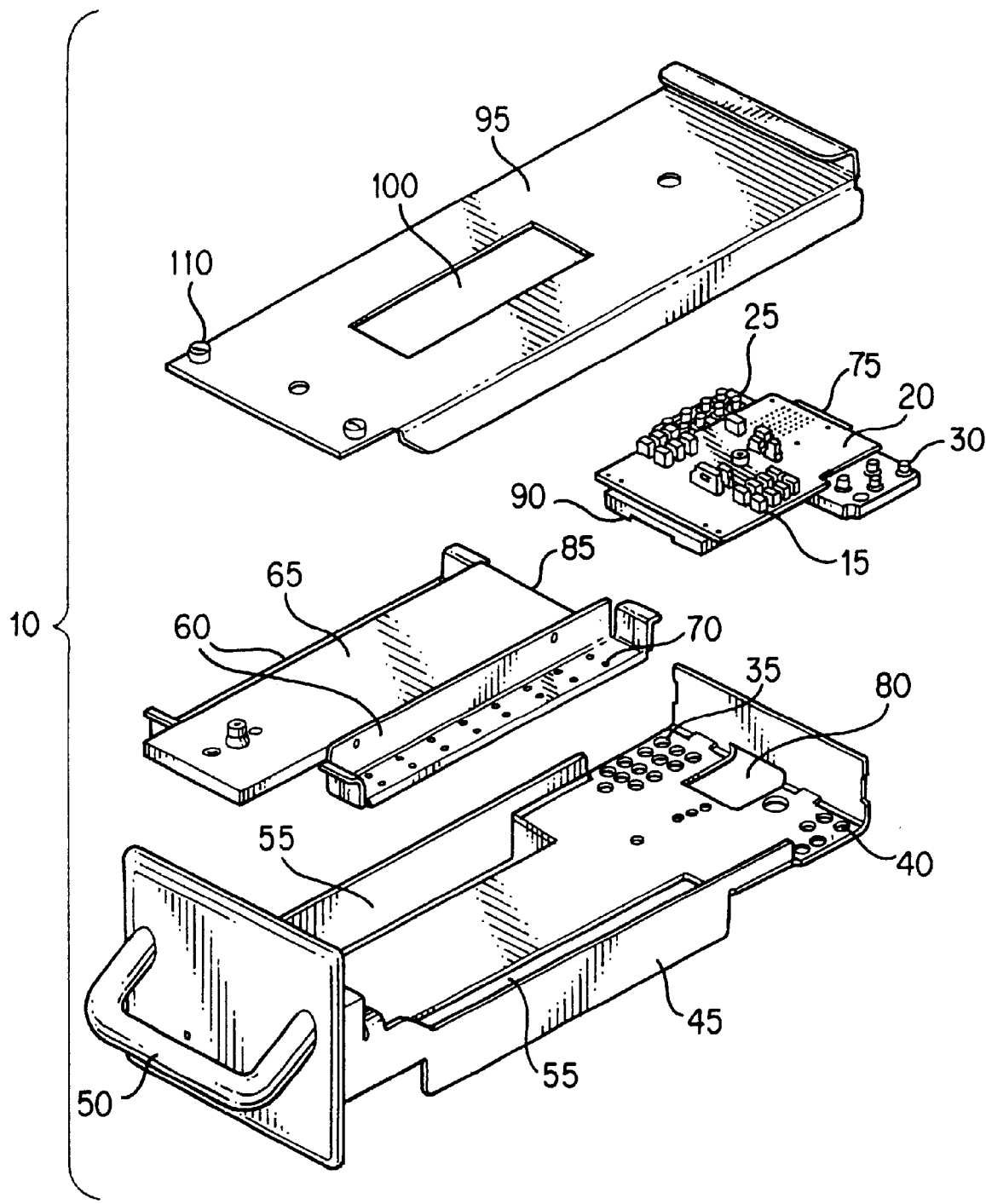
FIG. 1 is an exploded view of various components of a test fixture customization adapter enclosure.

The present invention is described in a non-limiting, but merely illustrative context of a test fixture customization adapter enclosure for use in testing devices. With reference to the drawings, an enclosure, such as an test fixture customization adapter enclosure 10 is illustrated in FIG. 1. The test fixture 10 is illustrated as including various modular components. One such modular component is a fixture interconnect assembly 15. The fixture interconnect assembly 15 contains elements common to most adapters (not shown) in a particular design family. The adapter is described in co-pending U.S. patent applications Ser. No. 09/026,066, entitled "REMOVABLE FIXTURE ADAPTER WITH PNEUMATIC ACTUATORS" and Ser. No. 09/026,083, entitled "REMOVABLE FIXTURE ADAPTER WITH RF CONNECTIONS", the disclosures of which are incorporated by reference.

The common elements on the fixture interconnect assembly 15 are secured on a base plate 20. These elements may be pneumatic connectors 25 and RF connectors 30. Each of the connectors 25, 30 comprise double male connectors, one on top of the base plate 20 and one underneath the base plate 20. The connections underneath couple to female connectors 35, 40 located on a chassis assembly 45. The connections on top of the base plate 20 couple to the DUT (not shown). Alternatively, female connectors can be located under the base plate 20 which couple to male connectors located on the chassis assembly 45. Other elements that may be secured to the base plate 20 include power outlet, electrical signals, etc. Since the fixture interconnect assembly 15 is a modular assembly, economies of scale can be realized by leveraging the use of these common components for various DUTs.

The chassis assembly 45, which is a drawer like mechanism, forms the foundation of the enclosure 10. The chassis is, for illustrative purposes, generally rectangular in configuration. The front end of the chassis assembly 45 includes a wall with a handle 50. The female connectors 35, 40 located on the chassis assembly 45 are closer to the wall opposite the handle 50. In addition, the chassis assembly 45 contains recesses 55 located on either side of the rectangular configuration, extending lengthwise from the wall with the handle 50. These recesses 55 form the sides of cable trays 60 connected to a customization base 65.

The adapter is mounted to the customization base 65. The customization base 65 provides the locating, holding and engagement functions for the adapter. The cable trays 60 are located on either side of the base 65 and allow for easy access for routing and servicing electrical cables and pneumatic tubes required to engage and test the device. For illustrative purposes only, sixteen holes 70 are illustrated. The holes 70 are arranged in two rows of eight holes each, with the holes 70 in each row extending transversely of the length of the cable trays 60. The holes 70 are used to secure the cables of the adapter to the cable trays 60. The cables may be secured to the cable trays 60 with various articles such as tie wraps, cable ties or can be clipped to the cable trays 60. Ease of access to all cables, tubes and sensors greatly enhances assembly and service of the adapter. The wires from the adapter lay in the cable trays 60 and are eventually secured in place after the assembly.

The fixture interconnect assembly 15 connects to the chassis assembly 45 through a tab 75 located on the back of the fixture interconnect assembly 15. The tab 75 interlocks under an aperture 80 located at the base of the center of the wall opposite the handle 50. The fixture interconnect assembly 15 is then secured in place with fasteners to the chassis assembly 45.

The customization base 65 connects to the chassis assembly 45 through a tab 85 located on the rear of the customization base 65. The tab 85 interlocks to the aperture 90 at the front of the fixture interconnect assembly 15. The customization base 65 is then secured in place with fasteners to the chassis assembly 45. The recesses 55 essentially enclose the cable trays 60 to form a protection for the cables and wires that lay in the trays 60. Thus, the chassis assembly 45 forms a protective shell of the adapter.

Figure 3:
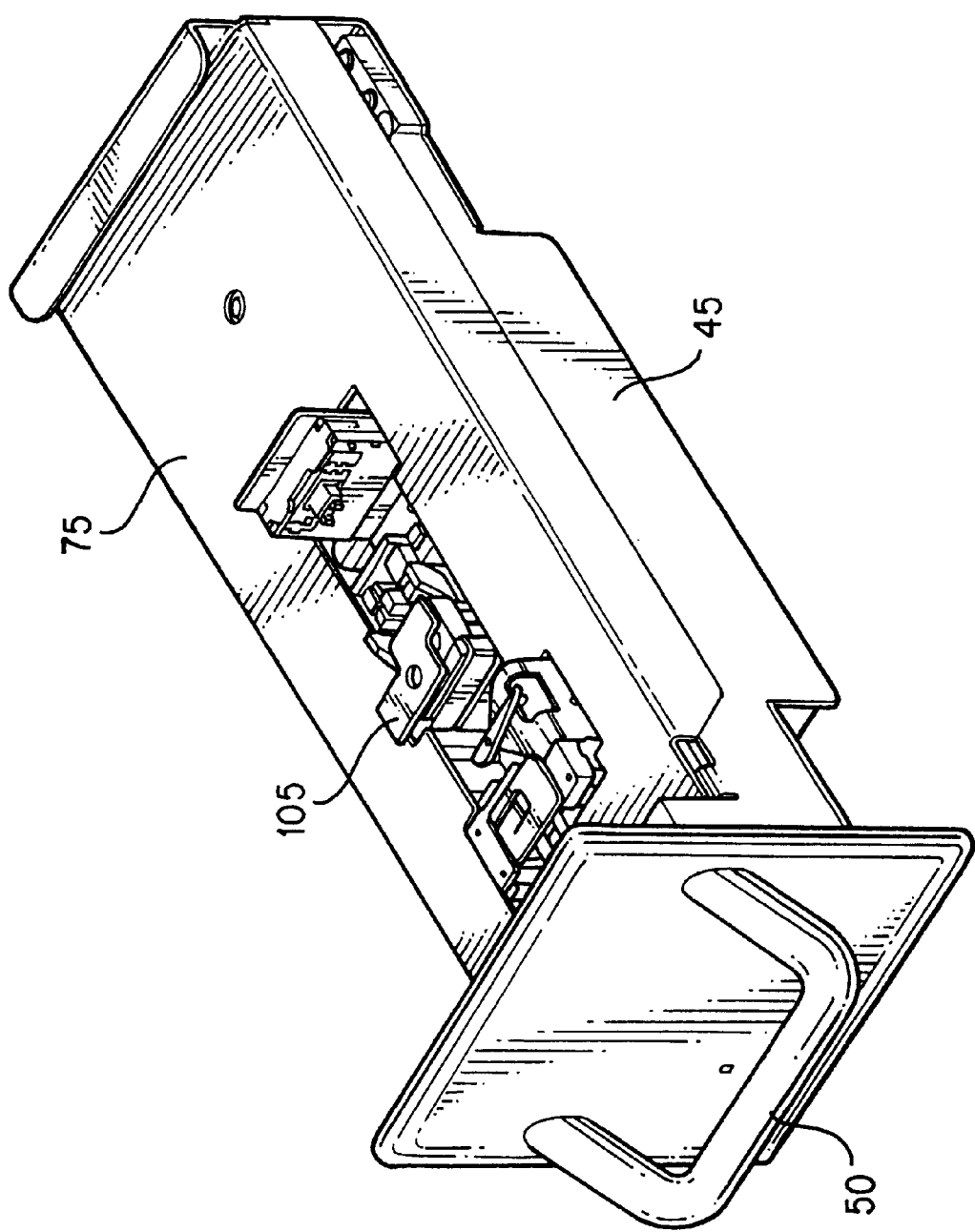
FIG. 3 is a perspective view of the test fixture customization adapter enclosure with a cover and DUT engagement mechanism.

The cover 95 encloses the chassis assembly 45. An opening 100 in the cover 95 is optimized to protect the area around the adapter. The size of the opening 100 may vary depending on the size and shape of the DUT engagement mechanism 105 (FIG. 3). The DUT engagement mechanism 105 is a component that holds the DUT and connects the DUT to the adapter. The cover 95 incorporates thumbscrews 110 which allows the cover 95 to be removed without tools. Since the cover 95 is easily removable, it gives full access to all of the components that need service without having to remove any of the components. The opening 100 in the cover 95 is modified for each unique DUT engagement mechanism 105. The cover 95 protects the DUT engagement mechanism 105 from foreign objects. Thus, as shown in FIG. 3, the chassis assembly 45, customization base 65 and cover 95 form a protective enclosure for the DUT.

Figure 2:
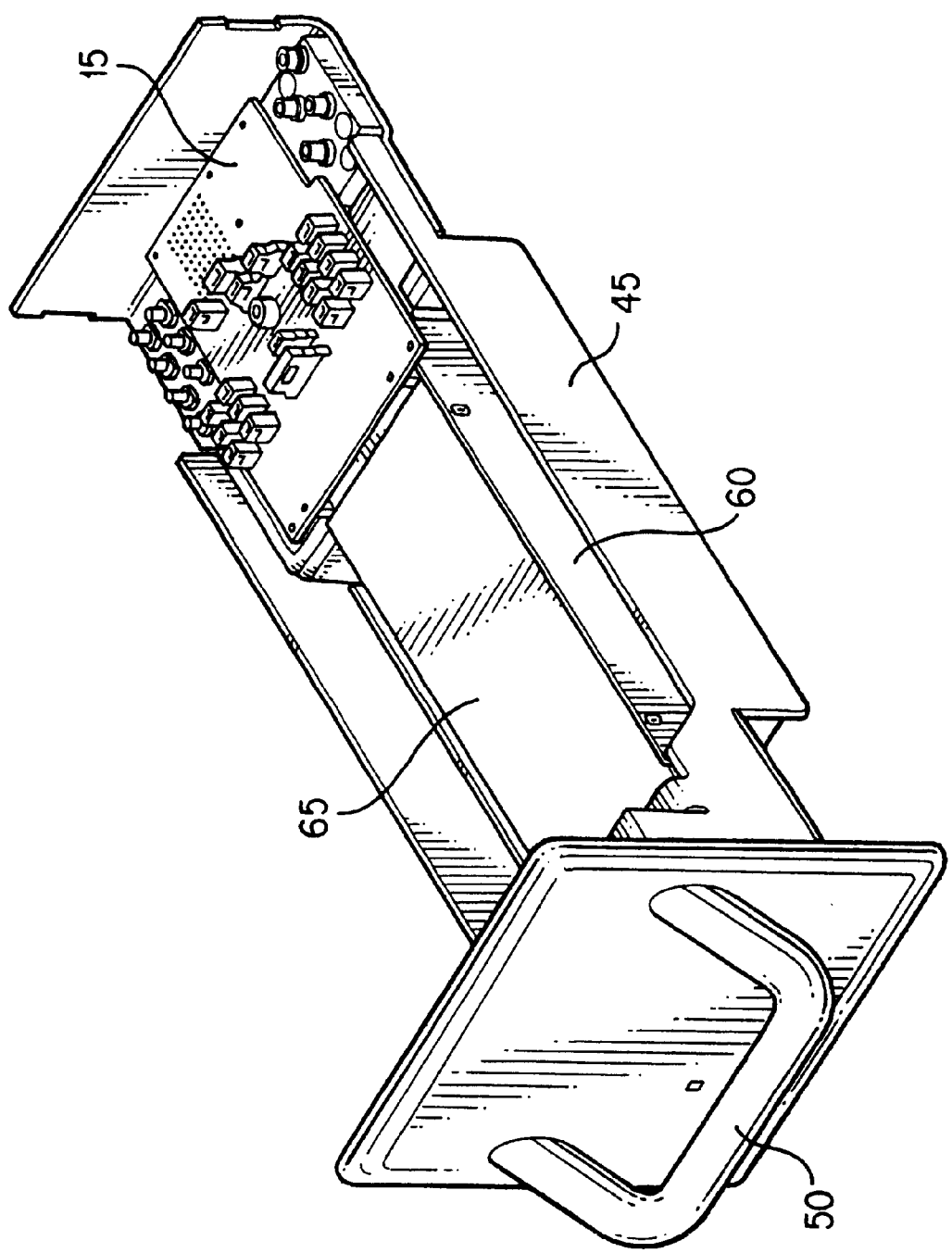
FIG. 2 is a perspective view of the test fixture customization adapter enclosure without a cover.

FIG. 2 illustrates a perspective view of the fixture interconnect assembly 15 and the customization base 65 mounted to the chassis assembly 45. The customization base 65 mounts on the chassis assembly 45 against the wall with the handle 50, and the fixture interconnect assembly 15 mounts on the chassis assembly 45 against the wall opposite the handle 50. Alternatively, these components can be located the other way around. These modular components offer significant improvements in ease of assembly due to accessibility of all components. Separation of the customization functions (by means of the customization base 65) from the common functions (by means of the fixture interconnect assembly 15) greatly reduces the degree of complexity and the number of custom components needed to design a new adapter, thus reducing overall design time. Also, the quantity of custom components is reduced resulting in quicker prototype, production and component fabrication, thereby reducing time and cost.

Although a preferred embodiment of the present invention and its advantages have been described in detail, it should be understood that various changes, substitutions and alterations can be made herein without departing from the spirit and scope of the invention as defined by the appended claims and their equivalents.

What is claim is:

1. An enclosure for use with a device under test, the enclosure comprising:

a fixture interconnect component which includes elements common to various devices under test;

a base connected to at least one cable tray, a chassis, wherein said fixture interconnect component and said base mount to said chassis; and a cover mounted to the chassis, wherein said cover includes an opening.

2. The enclosure of claim 1, wherein said opening is customized to the device under test.

3. The enclosure of claim 1, wherein said cover comprises one or more thumb screws, and said cover is mounted to said chassis with said one or more thumb screws.

4. The enclosure of claim 1, wherein said base is modular.

5. The enclosure of claim 1, wherein said fixture interconnect component is modular.

6. The enclosure of claim 1, wherein said chassis includes at least one recess into which said tray rests, and said recess forms the sides of the tray.

7. The enclosure of claim 1, wherein said tray secures cables and tubes for the device under test.

8. The enclosure of claim 1, wherein said base provides locating, holding and engagement functions of the device under test.

9. The enclosure of claim 1, wherein said fixture interconnect component includes at least one tab which interlocks with at least one aperture in the chassis to mount said fixture interconnect component to said chassis.

10. The enclosure of claim 1, wherein said base includes at least one tab which interlocks to the chassis.

11. The enclosure of claim 1, wherein said fixture interconnect component and said base are secured to said chassis through fasteners.

12. The enclosure of claim 1, wherein said fixture interconnect component includes at least one tab which connects to said base.

13. The enclosure of claim 1, wherein said base is customized to an engagement mechanism capable of mounting to said base.

14. The enclosure of claim 1, further comprising:
an engagement mechanism mounted to said base.

15. An enclosure for use with a device under test, the enclosure comprising:
a fixture interconnect component which includes elements common to various devices under test;
a base;
a chassis, wherein said fixture interconnect component and said base mount to said chassis; and
a cover mounted to the chassis, wherein said cover includes an opening, and
wherein said fixture interconnect component includes at least one tab which interlocks with at least one aperture in the chassis to mount said fixture interconnect component to said chassis.

* * * * *